United States Patent
Yi et al.

(10) Patent No.: US 10,038,078 B2
(45) Date of Patent: Jul. 31, 2018

(54) INTEGRATION PROCESS OF FINFET SPACER FORMATION

(71) Applicant: Shanghai Huali Microelectronics Corporation, Shanghai (CN)

(72) Inventors: Hailan Yi, Shanghai (CN); Tong Lei, Shanghai (CN); Yongyue Chen, Shanghai (CN)

(73) Assignee: Shanghai Huali Microelectronics Corporation, Shanghai (CN)

( * ) Notice: Subject to any disclaimer, the term of this patent is extended or adjusted under 35 U.S.C. 154(b) by 0 days.

(21) Appl. No.: 15/429,193

(22) Filed: Feb. 10, 2017

(65) Prior Publication Data

US 2018/0175169 A1    Jun. 21, 2018

(30) Foreign Application Priority Data

Dec. 16, 2016 (CN) .......................... 2016 1 1167849

(51) Int. Cl.
*H01L 21/311* (2006.01)
*H01L 29/66* (2006.01)
*H01L 21/02* (2006.01)

(52) U.S. Cl.
CPC .... *H01L 29/66795* (2013.01); *H01L 21/0217* (2013.01); *H01L 21/0228* (2013.01); *H01L 21/02164* (2013.01); *H01L 21/02271* (2013.01); *H01L 21/31111* (2013.01); *H01L 21/31116* (2013.01)

(58) Field of Classification Search
CPC .......... H01L 29/66553; H01L 29/6656; H01L 21/02227; H01L 29/66795
See application file for complete search history.

(56) References Cited

U.S. PATENT DOCUMENTS

| | | | |
|---|---|---|---|
| 7,202,187 B2 * | 4/2007 | Ramachandran ... | H01L 21/3185 257/E21.293 |
| 2014/0264604 A1 * | 9/2014 | Tsai ...................... | H01L 29/785 257/347 |

* cited by examiner

*Primary Examiner* — Selim Ahmed
*Assistant Examiner* — Evan Clinton
(74) *Attorney, Agent, or Firm* — Kilpatrick Townsend & Stockton, LLP

(57) ABSTRACT

A novel plasma process is introduced as an improvement over conventional plasma processes during formation of spacers for FinFET devices. Under this novel plasma process, an oxide layer is grown over sidewall materials and low energy plasma gas is used for the over-etching of the corner areas of the sidewalls. The oxide layer can effectively protect the sidewall materials during the over-etching by the low energy plasma gas and thus to reduce the aforementioned CD losses introduced by the low energy plasma gas. This improved low energy plasma etching technique can protect the fin structure from CD losses as compared to the conventional low energy plasma process, and also avoid damaging fin silicon structure with reduced Si losses as compared to the conventional high energy plasma process.

10 Claims, 8 Drawing Sheets

INTEGRATION PROCESS OF FINFET SPACER FORMATION

BACKGROUND OF THE INVENTION

The present invention is directed to semiconductor processes and devices.

Since the early days when Dr. Jack Kilby at Texus Instrument invented the integrated circuit, scientists and engineers have made numerous inventions and improvements on semiconductor devices and processes. The last five decades or so have seen a significant reduction in semiconductor sizes, which translate to ever increasing processing speed and decreasing power consumption. And so far, the development of semiconductor has generally followed Moore's Law, which roughly states that the number of transistors in a dense integrated circuit doubles approximately every two years. Now, semiconductor processes are pushing toward below 20 nm, where some companies are now working on 14 nm processes. Just to provide a reference, a silicon atom is about 0.2 nm, which means the distance between two discrete components manufactured by a 20 nm process is just about a hundred silicon atoms.

Manufacturing semiconductor devices has thus become more and more challenging and pushing toward the boundary of what physically possible. Huali Microeletronic Corporation™ is one of the leading semiconductor fabrication companies that has focused on the research and development of semiconductor devices and processes.

Fin field-effect transistor (FinFET) devices include a transistor architecture that uses raised source-to-drain channel regions, referred to as fins. A FinFET device can be built on a silicon-on-insulator (SOI) substrate, where a semiconductor material, such as silicon, is patterned into a fin-like shape and functions as the channel of the transistor. A gate can be wrapped around and over the fin. A double or dual gate structure includes a gate oxide and gate contact formed on two sides of the channel. A 3D tri-gate FinFET includes a gate structure wrapped on three sides of a fin. Unlike a 2D planar FET, in a 3D FinFET device, a channel is formed perpendicular to the upper surface of the semiconducting substrate, thereby reducing the physical size of the FinFET device. Thus, the 3D tri-gate FinFET structure effectively overcomes the transistor size problem of a FinFET device and improves device performance. However, compared to a 2D planar FinFET, the three gate and vertical fin structure of the 3D tri-gate FinFET device can increases the difficulty of integrating 3D tri-gate FinFET devices.

For example, etching of a nitride spacer adjacent to the gate is one of the critical challenges in FinFET device integration process. A common etching method of the nitride spacer is plasma etching. Etchants that can be used in a plasma process for removing polycrystalline silicon include HCl, HBr, HI, and Cl2, alone or in combination with each other and/or one or more of He, Ar, Xe, N2, and O2. A suitable etchant that can be used for removing a silicon oxide is a plasma comprising CF4/CHF3, or CF4/CH2F2. A suitable etchant for removing silicon nitride is a plasma comprising CF4/HBr. In operation of the plasma process, plasma gases can be flowed into internal chamber and converted into plasma by energy input from a reaction coil. An RF bias can be generated at a substrate to draw plasma components to a surface of substrate to etch a material at such surface. As the etch proceeds, the concentration of the evolved reaction products and/or etchant gases can be monitored. Monitoring of the etchant debris can be accomplished by, for example, spectroscopic methods, including, for example, ultraviolet-visible spectroscopy and mass spectrometry.

Figure 1:
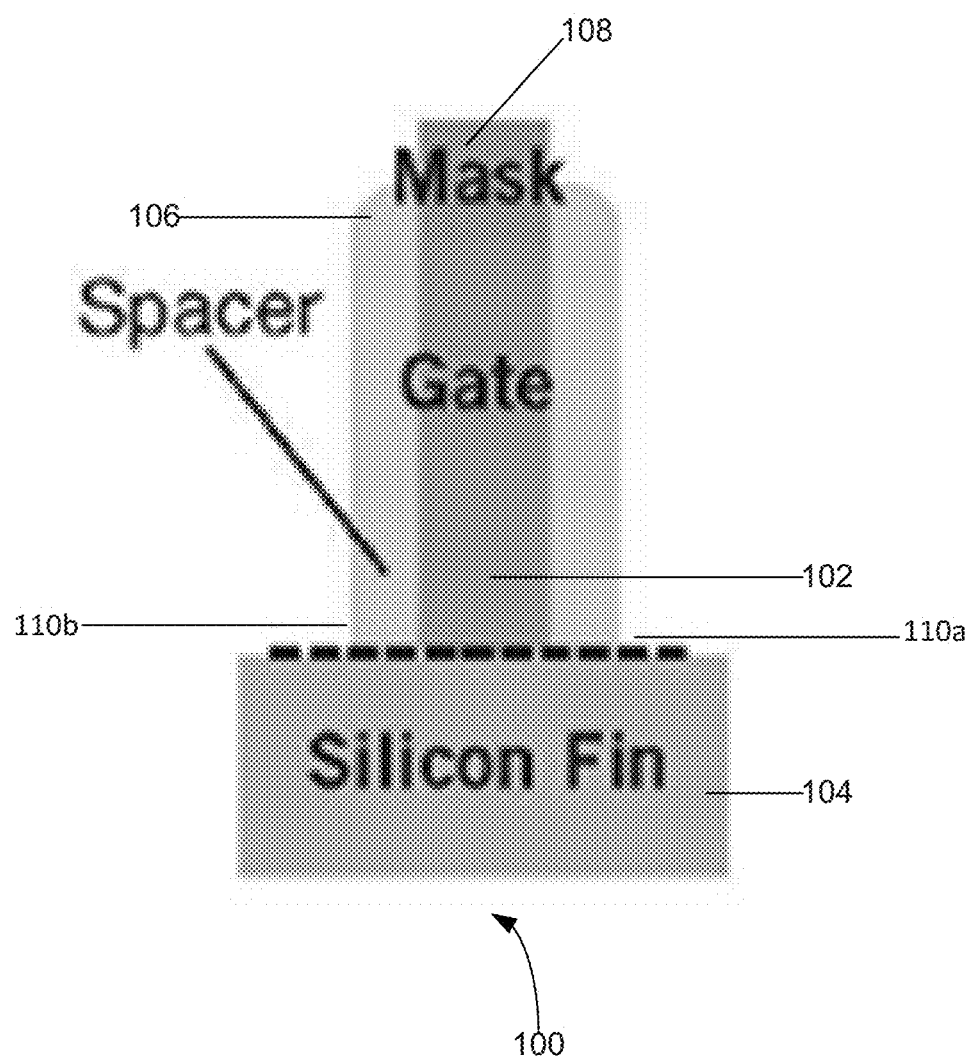
FIG. 1 illustrates a segment of a conventional 3D tri-gate FinFET (Fin Field Effect Transistor) device.

A further understanding of the nature and advantages of various embodiments may be realized by reference to the following figures. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION OF THE INVENTION

The present disclosure relates to fabricating spacer structures on integrated circuit products having different gate pitch dimensions and the resulting products.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification (including any accompanying claims, abstract, and drawings), may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. Section 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

Typically, as described above, the gate structure of a transistor will include at least one sidewall spacer positioned adjacent the gate structure. The sidewall spacers are typically made of silicon nitride (which has a relatively high k-value of, e.g., about 7-8) and they are normally formed very soon after the sacrificial gate structure is formed for devices manufactured using the replacement gate technique. For replacement gate structures, two of the primary purposes of the silicon nitride spacers are to define the gate cavity in the replacement gate manufacturing process and to protect the final replacement gate structure.

FIG. 1 illustrates a segment of a conventional 3D tri-gate FinFET (Fin Field Effect Transistor) device 100. This particular FinFET device 100 comprises a gate 102 and fins 104 on an underlying substrate (not shown). As shown, the gate 102 is surrounded by spacers 106 and a hard mask 108 is formed over gate 102. As described above, during the conventional FinFET device manufacturing, when fabricating a transistor gate, spacer material is typically applied to the transistor gate 102, and then partially removed or etched to form sidewall spacers 106 on a sidewall of the transistor gate. During the etching of the sidewall spacers 106, due to the 3D structure of the FinFET device 100, it is difficult to remove the SiN film around the corners 110a and 110b as shown in FIG. 1. Over etching is typically needed to remove the SiN film around these corners during the conventional process. Compared to 30% etching time typically required for etching a 2D planar device, etching time required by a FinFET device can be in the range of 200% to 400%. When the silicon fin 104 is exposed, over etching can damage fin structure, and thus to negatively affect the performance of FinFET device 100.

Figure 2:
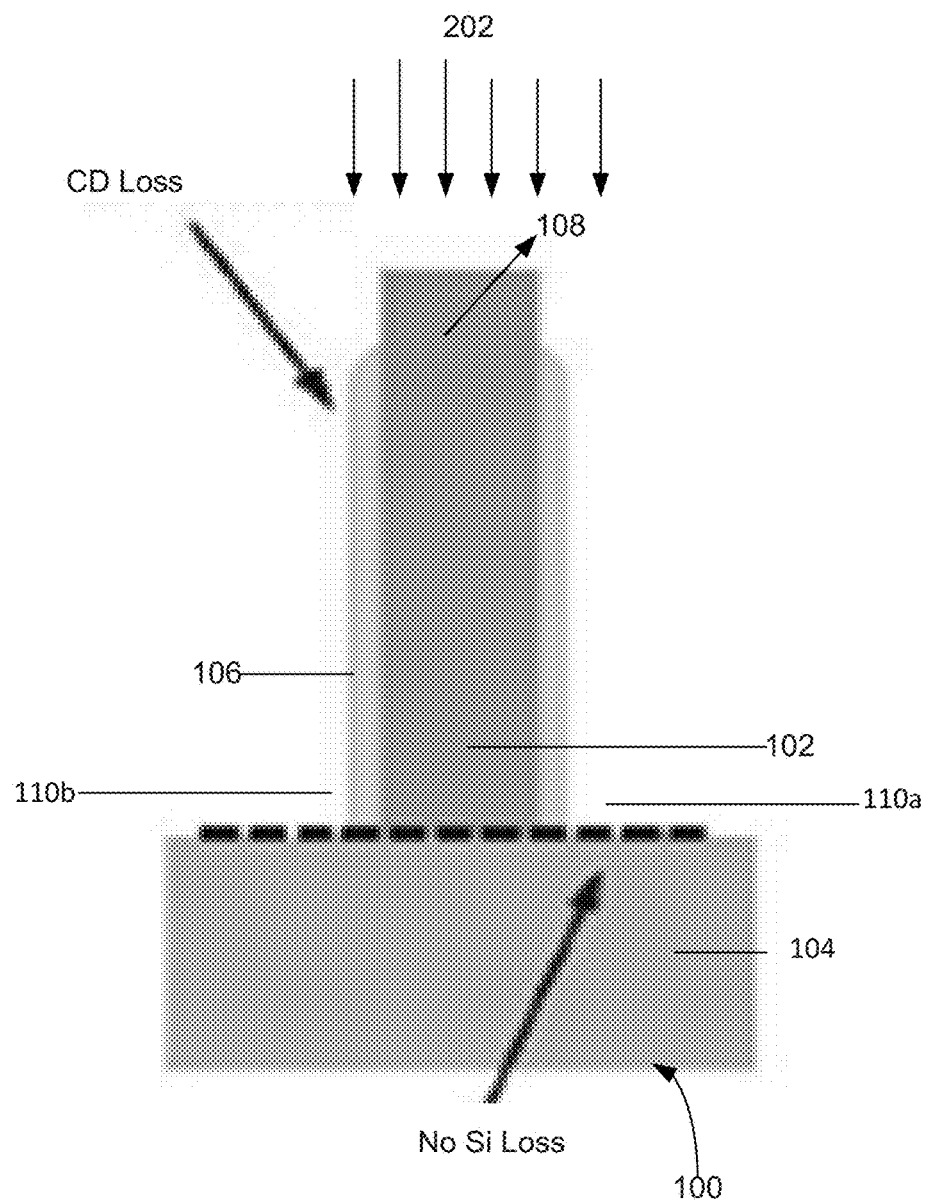
FIG. 2 illustrates low energy plasma gas may be employed during a sidewall etching processes incorporated in some conventional FinFET manufacturing processes to smooth corners.

Conventionally, for etching of the 3D FinFET device 100 around corners, such as corners 110a and 110b, plasma etching is typically employed. FIG. 2 illustrates low energy plasma gas may be employed during a sidewall etching processes incorporated in some conventional FinFET manufacturing processes to smooth corners 110a and 110b. As shown, low energy plasma gas 202 may be drawn to the silicon fin 104 as described above to bombard corners 110a and 110b. As shown, during this plasma etching, removal of silicon at silicon fin 104 is unavoidable due to the bombardment of plasma gas 202 is also in the direction towards the surface of the silicon fin 104. For minimizing this Si loss, low energy plasma gas 202 is selected for the over-etching, typically around 10 to 100 eV. The low energy plasma gas process illustrated in FIG. 2 has the property to effectively smooth the corners 110a and 110b by removing sidewall materials around those areas while having weak horizontal etching effect with little Si loss. Thus, the low energy plasma gas process shown in FIG. 2 can effectively protect the fin structure and not negatively affect the device performance. However, the low energy plasma process shown in FIG. 2 can etch the sidewall materials at the vertical direction of the spacers 106 and thus reduce the thickness of the spacers 116. This can cause loss of the critical dimension (CD) of FinFET device 100.

Figure 3:
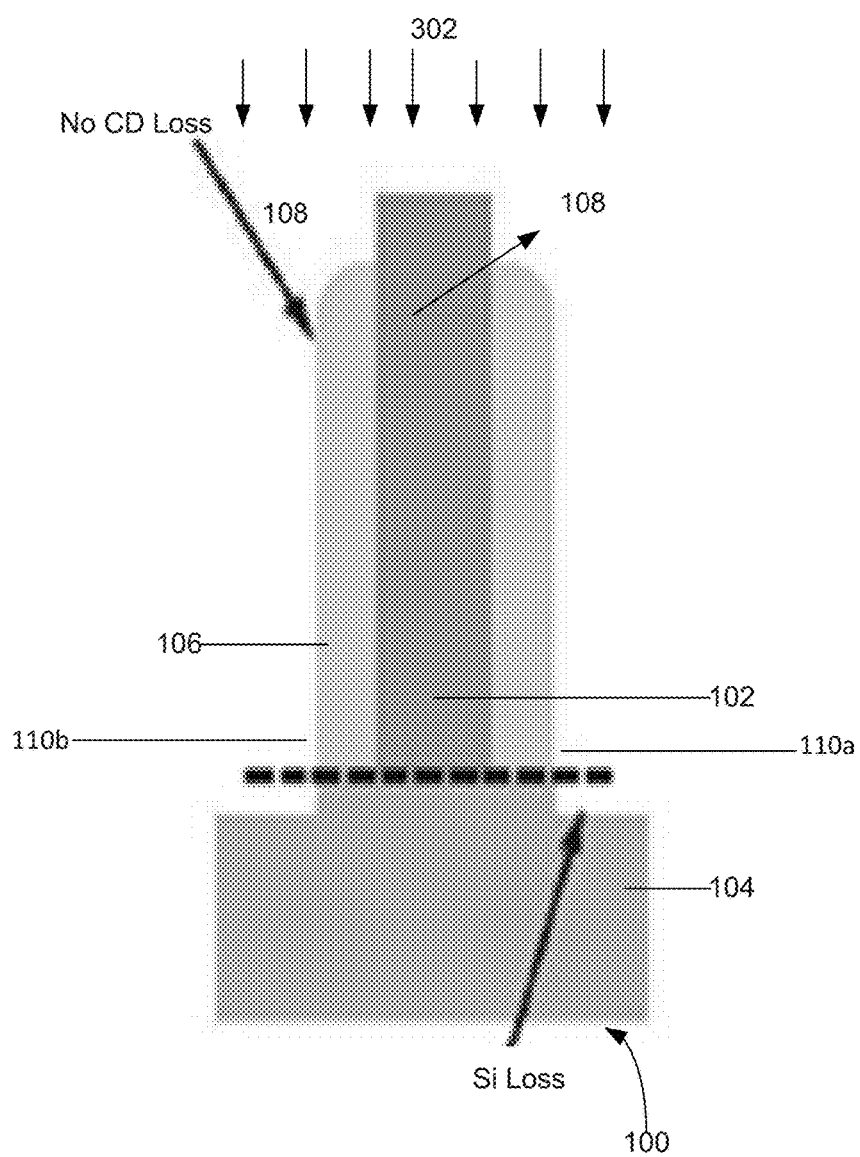
FIG. 3 illustrates high energy plasma gas may be employed during a sidewall etching process in some FinFET conventional processes to smooth corners.

FIG. 3 illustrates high energy plasma gas 302 may be employed during a sidewall etching process in some FinFET conventional processes to smooth corners 110a and 110b. As shown, high energy plasma gas 302 may be drawn to the silicon fin 104 to bombard corners 110a and 110b. As compared to the low energy plasma process shown in FIG. 2, the high energy plasma process has weak vertical etching effect and thus may reduce or avoid the CD loss introduced by the low energy plasma process shown in FIG. 2. However, as also compared to the low energy plasma process shown in FIG. 2, the high energy plasma process shown in FIG. 3 has strong horizontal etching effect and thus will cause more Si losses than the low energy plasma process. As shown, during the high energy plasma process, Si may be undesirably removed at the corner areas of 110a and 110b.

To address the aforementioned problems during the low energy and/or high energy plasma process, a novel plasma process is introduced as an improvement. Under this novel plasma process, an oxide layer is grown over the sidewall materials and low energy plasma gas is used for the over-etching of the corner areas of the sidewalls. The oxide layer can effectively protect the sidewall materials during the over-etching by the low energy plasma gas and thus to reduce the aforementioned CD losses introduced by the low energy plasma gas. This improved low energy plasma etching technique can protect the fin structure from CD losses as compared to the conventional low energy plasma process, and also avoid damaging fin silicon structure with reduced Si losses as compared to the conventional high energy plasma process.

As will be appreciated by those skilled in the art after a complete reading of the present application, the methods and structures disclosed herein may be used when forming 3D transistor devices. For purposes of explanation only, the inventions disclosed herein will be described in the context of forming illustrative 3D FET devices in perspective views. The transistor devices that are depicted in the attached drawings may be either NMOS or PMOS devices. Additionally, various doped regions, e.g., source/drain regions, halo implant regions, well regions and the like, are also not depicted in the attached drawings. The illustrative integrated circuit product 400 depicted in the drawings is formed above an substrate (not shown) that may have a variety of configurations, such as the depicted bulk silicon configuration. The substrate may be made of silicon or it may be made of materials other than silicon. Thus, the terms "substrate" or "semiconductor substrate" should be understood to cover all semiconducting materials and all forms of such materials.

Figure 4A:
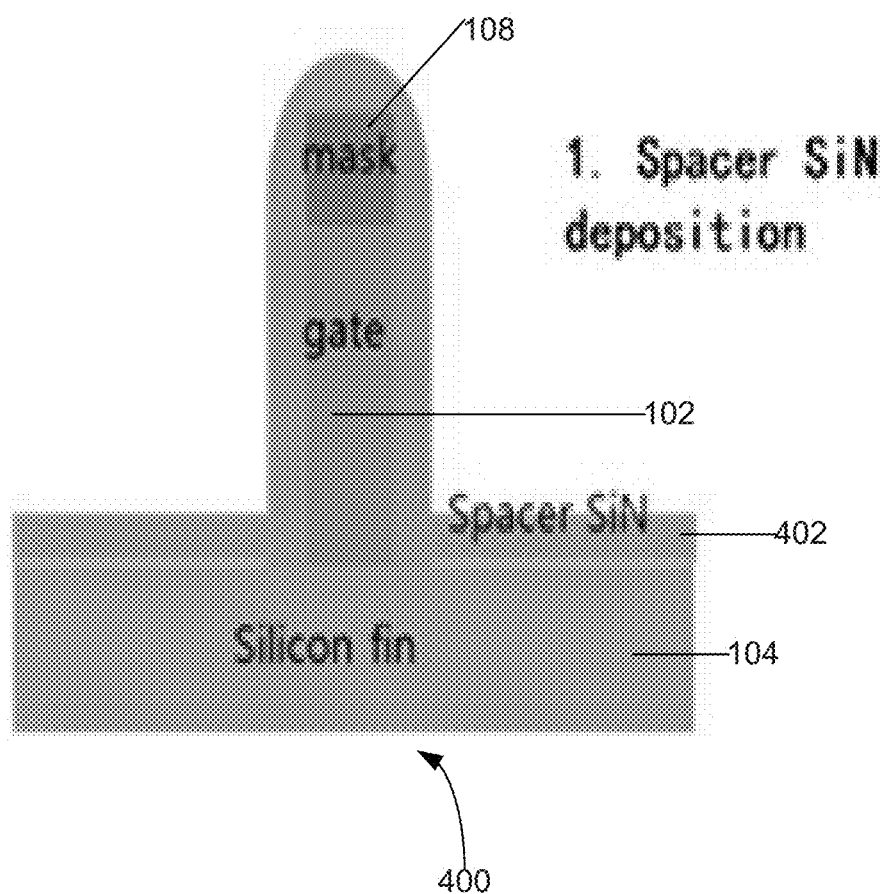
FIG. 4A generally illustrates a silicon-nitride layer can be deposited over a gate structure forming spacers to the gate structure during the improved low energy plasma process.

FIGS. 4A-D illustrate an embodiment of the improved low energy process in accordance with the disclosure. They will be described with reference to FIG. 1. FIG. 4A generally illustrates a silicon-nitride layer can be deposited over a gate structure forming spacers to the gate structure during the improved low energy plasma process. As shown, the device 400 can comprise a silicon fin 104 having a transistor gate construction 102 formed over silicon fin 104. As shown, the transistor gate structure 102 can comprise hard mask cap 108. As also shown, a silicon nitride (SiN) layer 402 can be formed over the surface of gate 102 as well as the silicon fin 104, so that it covers both silicon fin 104 and transistor gate structure 102 for forming spacers 106. In some examples, the thickness of the SiN layer 402 can be in the range of 50 Angstroms to 300 Angstroms.

Figure 4B:
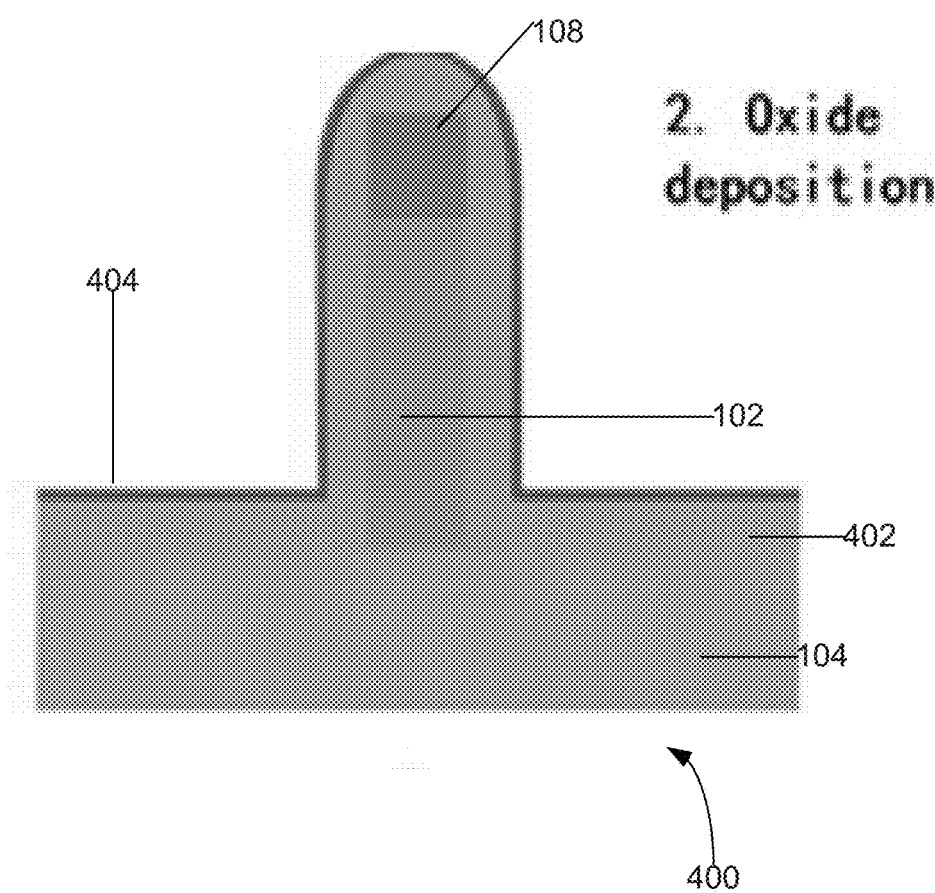
FIG. 4B illustrates an oxide layer can be grown over the entire surface of the SiN layer so that it covers the SiN layer.

FIG. 4B illustrates an oxide layer 404 can be grown over the entire surface of the SiN layer 402 so that it covers the SiN layer 402. In some examples, the oxide layer 404 can comprise SiOx and can be grown using any suitable process such as an atomic layer deposition (ALD) or a chemical vapor deposition (CVD) process. In some examples, the thickness of the oxide layer 404 can be controlled in the range between 10 Angstroms to 100 Angstroms.

Figure 4C:
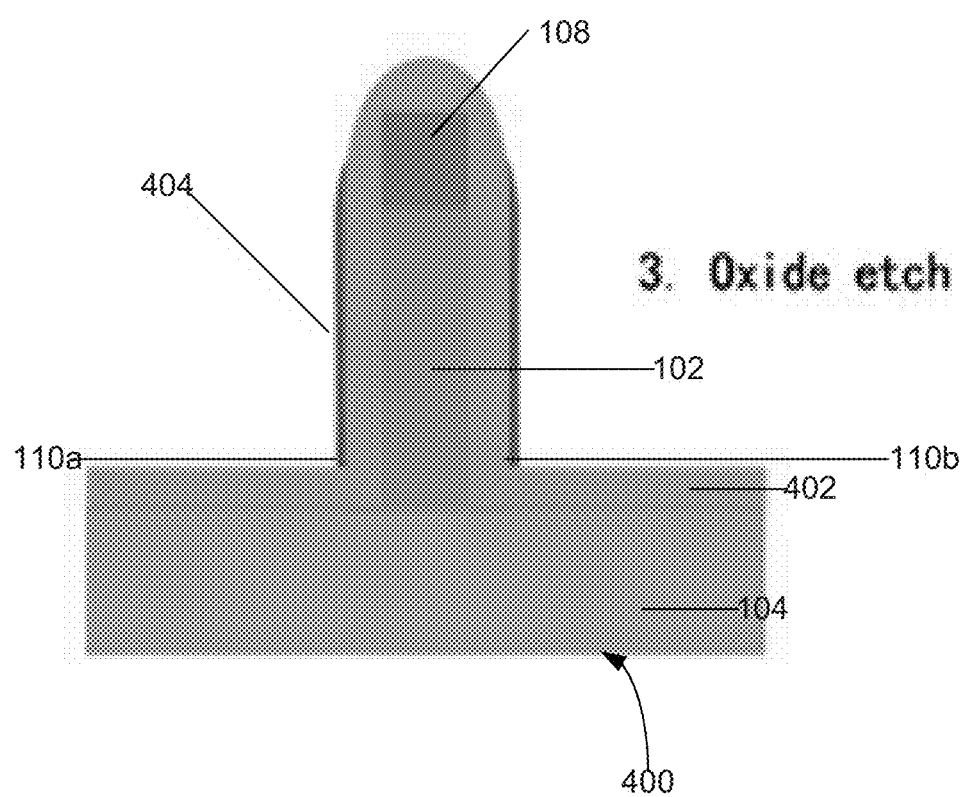
FIG. 4C illustrate a selective dry etching process can be performed to remove the oxide layer.
Figure 4D:
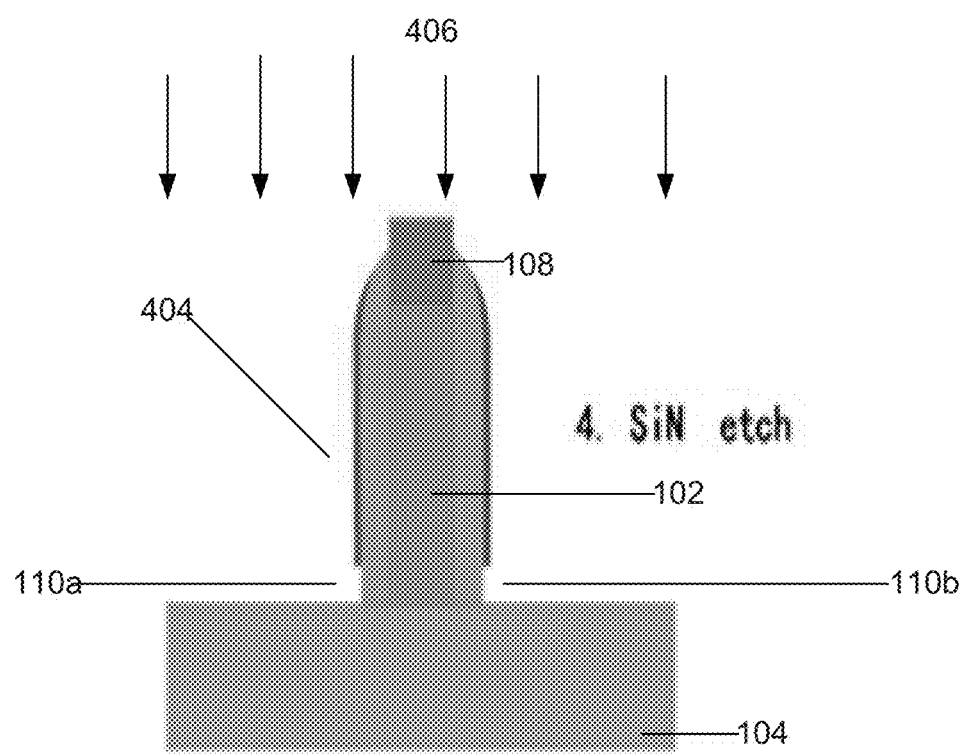
FIG. 4D illustrates low energy plasma gas can be released for etching the SiN materials on the sidewalls in a horizontal direction.
Figure 4E:
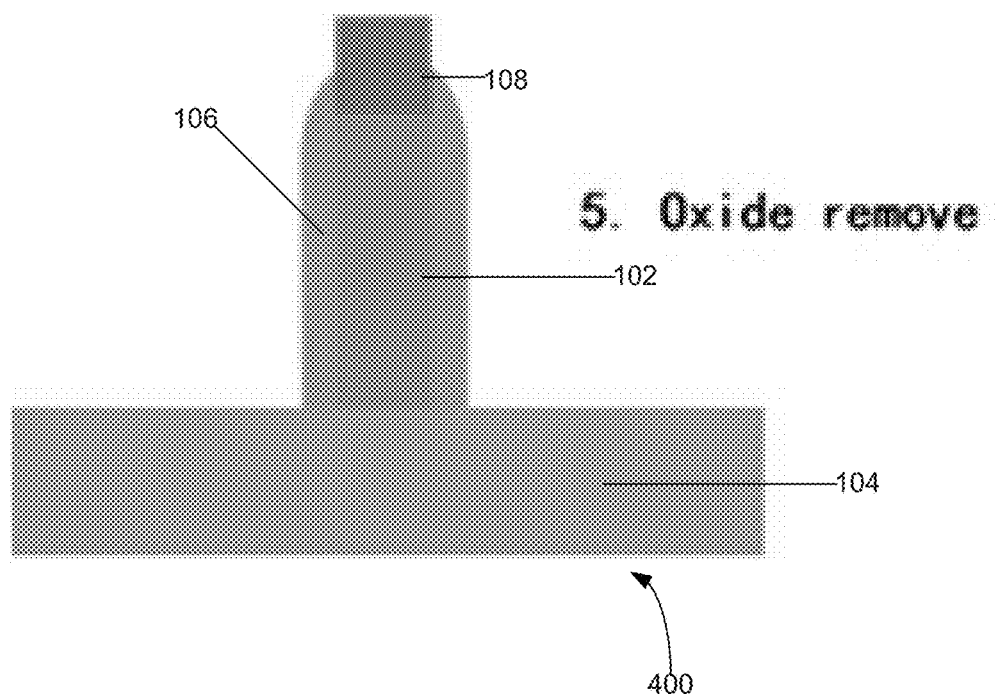
FIG. 4E illustrates the left-over oxide layer on the sidewalls can be removed using a wet etching process or a SiCoNi process to obtain the spacers.

FIG. 4C illustrate a selective dry etching process can be performed to remove the oxide layer 404 on the surface of silicon fin 104 as well the oxide layer 404 as on the tip of gate structure 102 (right over hard mask 108). As shown, after the the selective dry etching process shown in FIG. 4C, only oxide layer 404 on the sidewalls 402 in the vertical direction is left. Selective dry etching process is well understood in the art and will not be described in details in the present disclosure for clarity. FIG. 4D illustrates low energy plasma gas 402 can be released for etching the SiN materials on the sidewalls 402 in the horizontal direction. In some examples, the energy level of the plasma gas 402 can be controlled in the range between 10~100 eV. Over-etching may be performed to smooth the corners 110a and 110b as described above. As can be seen, the oxide layer 404 left on the sidewalls 402 in the vertical direction after the dry etching step shown in FIG. 4C can effectively protect the sidewalls 402 from horizontal bombardment by the low energy plasma gas 406 as described above and thus to avoid CD loss associated with the conventional low energy plasma gas process described above. FIG. 4E illustrates the left-over oxide layer 404 on the sidewalls 402 can be removed using a wet etching process or a SiCoNi process to obtain the spacers 106.

As will be readily apparent to those skilled in the art upon a complete reading of the present application, the improved process disclosed is applicable to a variety of devices, including, but not limited to, logic devices, memory devices, etc., and the methods disclosed herein may be employed to form N-type or P-type semiconductor devices. The methods and devices disclosed herein may be employed in manufacturing products using a variety of technologies, e.g., NMOS, PMOS, CMOS, etc., and they may be employed in manufacturing a variety of different devices, e.g., memory devices, logic devices, ASICs, etc. The various layers of material depicted in the following drawings may be formed by any of a variety of different known techniques, e.g., a chemical vapor deposition (CVD) process, an atomic layer deposition (ALD) process, a thermal growth process, spin-coating techniques, etc. Moreover, as used herein and in the attached claims, the word "adjacent" is to be given a broad interpretation and should be interpreted to cover situations where one feature actually contacts another feature or is in close proximity to that other feature.

Embodiments of the present invention provide many advantages over existing techniques and methods, as explained throughout the parts of the application. It is to be appreciated that embodiments of the present invention are compatible with existing systems and processes. For example, the shaped cavities described according to the embodiments of the present invention can be manufactured using existing equipment. The shaped cavities according to embodiments of the present invention can be easily used in manufacturing various types of devices, such as CMOS, PMOS, NMOS, etc.

While the above is a full description of the specific embodiments, various modifications, alternative constructions and equivalents may be used. In addition to what is described above, there are other embodiments as well. Therefore, the above description and illustrations should not be taken as limiting the scope of the present invention which is defined by the appended claims.

What is claimed is:

1. A method for fabricating 3D fin field-effect transistor (FinFET) device, the method comprising:
    providing a fin shaped silicon over a substrate;
    providing a gate structure wrapped around three sides of the fin shaped silicon;
    depositing a silicon-nitride (SiN) layer over an entire surface of the gate structure and the fin shaped silicon;
    depositing an oxide layer over an entire surface of the SiN layer, the oxide layer comprising a first portion over a tip of the gate structure, a second portion along a side of the gate structure in a vertical direction, and a third portion over the fin shaped silicon;
    performing an oxide etch process to remove the first portion of the oxide layer, a bottom portion of the second portion of the oxide layer, and the third portion of the oxide layer, leaving a top portion of the second portion of the oxide layer;
    performing an SiN etching process to remove portions of the SiN layer over the tip of the gate structure and over the fin shaped silicon; and
    performing an oxide removal process to remove the top portion of the second portion of the oxide layer such that the SiN layer in the vertical direction forms at least a sidewall spacer to the gate structure.

2. The method of claim 1, wherein the thickness of the oxide layer is between 10 Angstroms to 100 Angstroms.

3. The method of claim 1, wherein the oxide layer comprises silicon oxide.

4. The method of claim 1, wherein the oxide layer is deposited using an atomic layer deposition (ALD) process or a chemical vapor deposition (CVD) process.

5. The method of claim 1, wherein the oxide etch process includes a selectively dry etching step that selectively removes the third portion of the oxide layer.

6. The method of claim 5, the selectively dry etching step removes the oxide layer on a surface of a hard mask cap formed over the gate structure.

7. The method of claim 1, wherein the SiN etching process is a plasma process.

8. The method of claim 7, wherein the energy of the low energy plasma gas employed in the plasma process is between 10 eV to 100 eV.

9. The method of claim 7, further comprising performing an over-etching process to smooth at least a corner formed around the SiN layer and the fin shaped silicon.

10. The method of claim 1, wherein the oxide removal process is a wet etching process or a process employing SiCoNi.

* * * * *